United States Patent
Papi et al.

(10) Patent No.: US 9,945,249 B2
(45) Date of Patent: Apr. 17, 2018

(54) VENTILATION OF A PIECE OF ELECTRONIC EQUIPMENT OF A TURBOMACHINE

(71) Applicant: SNECMA, Paris (FR)

(72) Inventors: Andrea Papi, Paris (FR); Lucie Mathilde Dawson, Massy (FR); Elyse Tabouret, Antony (FR)

(73) Assignee: SNECMA, Paris (FR)

( * ) Notice: Subject to any disclaimer, the term of this patent is extended or adjusted under 35 U.S.C. 154(b) by 273 days.

(21) Appl. No.: 14/908,336

(22) PCT Filed: Jul. 31, 2014

(86) PCT No.: PCT/FR2014/052002
§ 371 (c)(1),
(2) Date: Jan. 28, 2016

(87) PCT Pub. No.: WO2015/015128
PCT Pub. Date: Feb. 5, 2015

(65) Prior Publication Data
US 2016/0160683 A1 Jun. 9, 2016

(30) Foreign Application Priority Data

Aug. 1, 2013 (FR) ...................................... 13 57673

(51) Int. Cl.
*F02C 1/00* (2006.01)
*F01D 25/12* (2006.01)
(Continued)

(52) U.S. Cl.
CPC ............... *F01D 25/12* (2013.01); *G06F 1/20* (2013.01); *H05K 7/20145* (2013.01);
(Continued)

(58) Field of Classification Search
CPC ........ F01D 25/12; F05D 2230/80; G06F 1/20; H05K 7/20145; Y02T 50/672; Y02T 50/675
See application file for complete search history.

(56) References Cited

U.S. PATENT DOCUMENTS 4,156,344 A * 5/1979 Cuthbertson ........... F02C 7/045
415/119
4,674,704 A * 6/1987 Altoz ................. H05K 7/20136
244/1 R
(Continued)

FOREIGN PATENT DOCUMENTS

FR 2 879 564 A1 6/2006
FR 2 960 912 A1 12/2011

OTHER PUBLICATIONS

International Search Report dated Nov. 3, 2014 for PCT/FR2014/052002 filed on Jul. 31, 2014.

*Primary Examiner* — Jesse Bogue
(74) *Attorney, Agent, or Firm* — Oblon McClelland, Maier & Neustadt, L.L.P.

(57) ABSTRACT

A piece of electronic equipment of a turbomachine, including a wall of which the inner surface defines at least one channel for the passage of a ventilating air stream of which the outlet opens on an outer surface of the wall with a view to discharging the ventilating air stream towards the outside of the equipment, wherein, at the outlet, a mechanism for diverting and/or guiding at least a portion of the discharged air stream, over at least a part of the outer surface of the wall.

9 Claims, 4 Drawing Sheets

(51) Int. Cl.
    *G06F 1/20*         (2006.01)
    *H05K 7/20*       (2006.01)

(52) U.S. Cl.
    CPC ......... *F05D 2230/80* (2013.01); *Y02T 50/672* (2013.01); *Y02T 50/675* (2013.01)

(56) References Cited

U.S. PATENT DOCUMENTS

| | | | |
|---|---|---|---|
| 7,307,840 B2* | 12/2007 | Hartung | H05K 7/20145 165/104.33 |
| 2003/0156385 A1* | 8/2003 | Askeland | G06F 1/182 361/679.51 |
| 2005/0279103 A1* | 12/2005 | Bowers | F01D 25/12 60/782 |
| 2009/0111370 A1 | 4/2009 | Porte et al. | |
| 2009/0175718 A1 | 7/2009 | Diaz et al. | |
| 2011/0186263 A1 | 8/2011 | Piesker | |

* cited by examiner

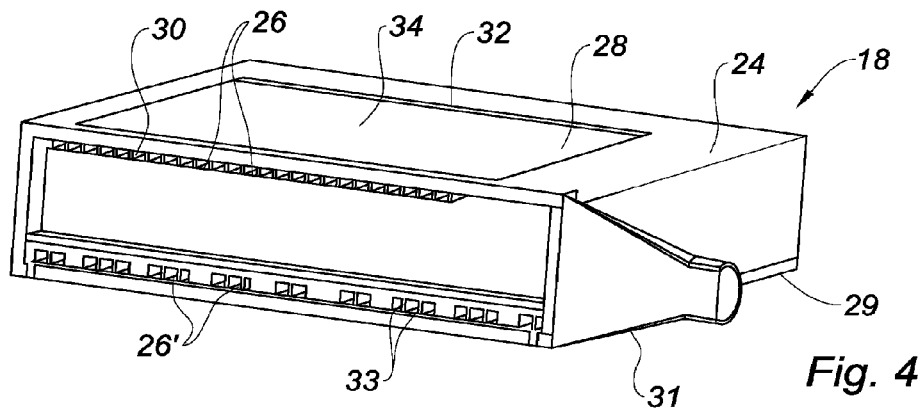
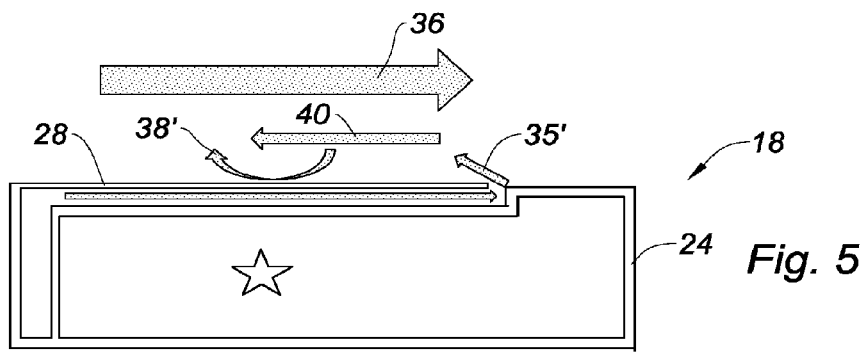
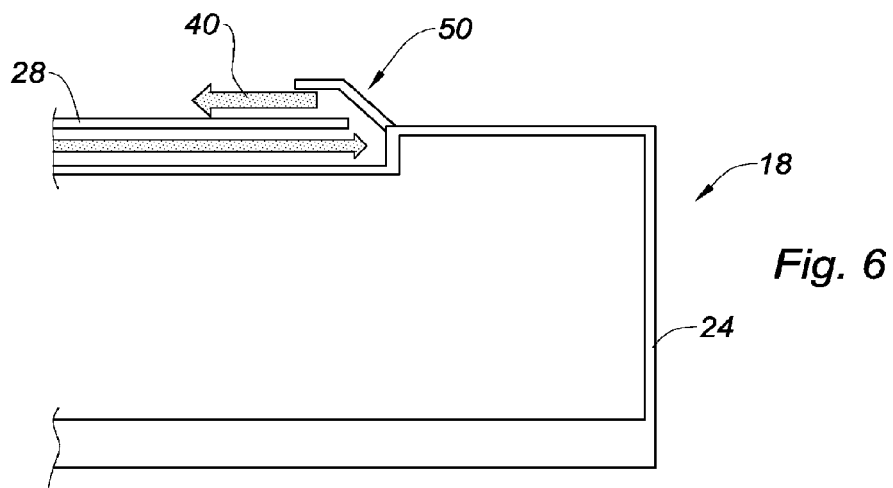

VENTILATION OF A PIECE OF ELECTRONIC EQUIPMENT OF A TURBOMACHINE

TECHNICAL FIELD

The present invention relates to a piece of electronic equipment of a turbine engine, this equipment being an on-board computer of the electronic engine control type EEC (Electronic Engine Control acronym), for example.

PRIOR ART

An aircraft turbine engine comprises at least one EEC-type on-board computer which in particular allows actuators of the engine to be monitored in order to optimize the turbine-engine performance (FR-B1-2 960 912). This computer is generally mounted together with other equipment (accessory gearbox AGB, exchangers, etc.) in the internal annular space in the nacelle of the turbine engine, the temperature of the air flow in this space being possibly relatively significant during operation.

The nacelle comprises a scoop for drawing off air during flight in order to supply air to the annular space in the nacelle, this air then being discharged through an air outlet grating of the nacelle. However, on the ground, this aeration is virtually non-existent and the natural convection in the annular space in the nacelle may prove to be insufficient to ensure the ventilation of the equipment thereof.

The EEC computer comprises a housing, inside which electronic boards are installed. These electronic boards have low temperature stability, which makes it necessary to ventilate the housing using a dedicated system comprising means for drawing off air flowing on the outside of the nacelle of the turbine engine.

In the current art, the housing of the computer is covered by a wall which defines ducts through which a ventilation air flow passes, the inlets of which are connected by a collector to the above-mentioned means for drawing off air and the outlets lead onto the outer surface of the wall. Some of the heat dissipated by the electronic boards during operation is absorbed by the ventilation air flow which circulates in the ducts, this air flow then leaving the ducts in order to be discharged into the annular space in the nacelle.

It has been noted that the amount of heat absorbed by the ventilation air flow is greater (approximately double) than the heat dissipated by the electronic boards. This is due to the fact that the ventilation air flow does not only absorb heat dissipated by the electronic boards, but also heat from the ambient air prevailing in the annular space in the nacelle. In fact, the ventilations ducts are separated from this ambient air by the wall of the computer, this ambient air transferring heat to the wall by convection, which is then absorbed by the ventilation air flow circulating in the ventilation ducts. The ventilation system of a computer of the above-mentioned type therefore currently has to be oversized, for example while significantly increasing the ventilation air flow rate, in order to be sure that the computer is ventilated in an optimum manner. Moreover, even with such a system, the thermal margins on the computer may remain reduced, having a significant impact on the reliability of the electronic boards.

In addition, the other equipment of the nacelle does not necessarily comprise dedicated ventilation systems, and therefore is subjected to the thermal environment of the nacelle. In turbine engines of which the equipment is arranged in a particular manner, it has been noted that active ventilation of the EEC computer brings about a tangential vortex in the annular space in the nacelle, which provides heat originating from the AGB and other heat sources to equipment that is sensitive to heat, and this is problematic.

The present invention in particular provides a simple, effective and economical solution to at least some of these problems.

SUMMARY OF THE INVENTION

The invention proposes a piece of electronic equipment for a turbine engine, comprising a wall of which the inner surface defines at least one duct through which a ventilation air flow passes, the outlet of which leads onto an outer surface of the wall in order to discharge the ventilation air flow towards the outside of the equipment, characterised in that it comprises, in the region of this outlet, means for diverting and/or guiding at least some of the discharged air flow over at least part of said outer surface of the wall.

According to the invention, the ventilation air flow which leaves the equipment is diverted and/or guided in order to sweep the equipment and thus improve the ventilation thereof. This air flow circulates on the wall of the equipment comprising or defining the outlet of the duct, and thus limits the heating of this wall by the ambient air flow around the equipment. This also makes it possible to reduce the temperature of the outlet of the duct. It is therefore conceivable either to increase the thermal margins on the computer by around ten degrees or to reduce the ventilation flow rate while retaining the previous margins. In the present application, thermal margin means the difference between the specification by the manufacturer defining the maximum permissible thermal resistance and a measurement made on an actual engine or in a laboratory.

The equipment according to the invention is, for example, an on-board computer of the EEC type and comprises a housing comprising electronic boards, said wall covering the housing.

The diverting and/or guiding means may comprise at least one member that is attached and fastened to the wall and/or the equipment, for example by bonding, brazing, welding, etc. This member or some members may be made of metal, plastics material or composite materials.

According to an embodiment of the invention, the outlet of the duct is formed by a slot, the diverting and/or guiding means comprising at least one metal sheet which extends along the slot and covers said slot at least in part. The slot may be formed in the wall of the equipment or may be defined, in a mounting position of the wall, between a peripheral edge of this wall and an edge opposite the housing of the equipment.

The metal sheet is inclined at least in part relative to the plane of the wall by an angle of between 30° and 60°, for example. This range of values makes it possible to limit the head losses of the ventilation air flow. The metal sheet may comprise a portion that is parallel to the plane of the wall. The metal sheet may extend at least in part within the duct. The metal sheet may be bent or swaged.

The equipment according to the invention may comprise a second wall, opposite the first wall, the inner surface of this second wall also defining at least one duct through which a ventilation air flow passes, the outlet of which leads onto an outer surface of this second wall. Advantageously, this outlet does not comprise guiding and/or diverting means of the above-mentioned type, such that the direction of the air flow discharged by this outlet is substantially opposite that of the air flow discharged by the outlet in the first wall.

The present invention also relates to a turbine engine, characterised in that it comprises at least one piece of equipment as described above. The turbine engine may comprise two pieces of equipment of this type, such as two EEC computers.

The invention also relates to a kit for modifying a piece of electronic equipment for a turbine engine, with a view to improving the ventilation thereof, characterised in that it comprises means for diverting and/or guiding an air flow, such as at least one metal sheet, which are intended to be attached and fastened to the equipment, in the region of the outlet of a duct through which an air flow for ventilating the equipment passes, such that a ventilation air flow circulates on an outer surface of the equipment. This kit makes it possible to modify an existing piece of electronic equipment in a simple and rapid manner with a view to improving the ventilation thereof, which is more cost-effective than replacing the entire piece of equipment with another piece of equipment.

The invention also relates to a method for modifying a piece of electronic equipment for a turbine engine, with a view to improving the ventilation thereof, characterised in that it comprises the steps consisting in attaching and fastening means for diverting and/or guiding an air flow, such as at least one metal sheet, to the equipment, in the region of the outlet of a duct through which an air flow for ventilating the equipment passes, such that a ventilation air flow circulates on an outer surface of the equipment.

The invention lastly relates to a method for ventilating a nacelle of a turbine engine, this nacelle defining an annular space in which equipment is mounted, including at least one such piece of equipment as described above (of the type comprising a first and a second wall), characterised in that it consists in ventilating a circumferential portion of the annular space using the air flow discharged through the outlet in the first wall and ventilating the remaining circumferential portion of the annular space using the air flow discharged through the outlet in the second wall.

This makes it possible to prevent a vortex from forming in the annular space in the nacelle, this annular space comprising two circumferential zones which are ventilated independently of one another and which may therefore have different temperatures. The EEC computer and other equipment that is sensitive to heat may thus be housed in a relatively cold zone that is different from the hotter zone in which the AGB gearbox is located. The invention thus makes it possible to predict in advance the ventilation air flows that will occur in the nacelle, and these air flows will therefore no longer be negatively affected, as they are in the prior art.

DESCRIPTION OF THE DRAWINGS

The invention will be better understood and other details, features and advantages of the invention will emerge upon reading the following description given by way of non-limiting example and with reference to the accompanying drawings, in which:

FIG. 4 is a schematic perspective sectional view along line IV-IV in FIG. 3, FIG. 5 is a schematic sectional view of an on-board computer according to the invention, FIG. 6 is a partial schematic sectional view of an on-board computer according to the invention, and shows a first embodiment of the invention.

DETAILED DESCRIPTION

Figure 1:
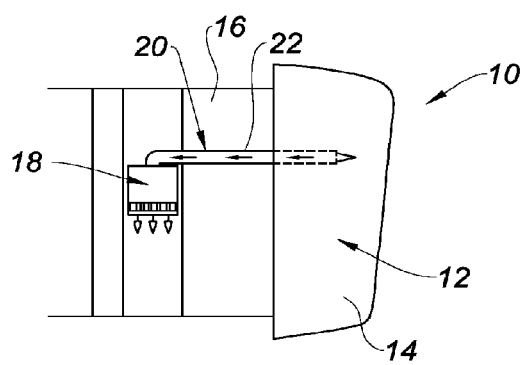
FIG. 1 is a partial schematic view of an aircraft turbine engine, this turbine engine being provided with a system for ventilating an on-board computer of the EEC type.

Reference is first made to FIGS. 1 to 4, which show the prior art for the invention, FIG. 1 showing an aircraft turbine engine 10, such as a bypass turbojet engine. This turbine engine typically comprises a nacelle 12 surrounding an engine (not shown) which comprises, from upstream to downstream (from right to left in FIG. 1), in the direction of flow of the gases in the turbine engine, a fan, compression stages, a combustion chamber, turbine stages and an exhaust nozzle.

The nacelle 12 comprises, at its upstream end, an air intake duct 14 and defines an annular space between an inner surface formed by an inner casing 16 and an outer surface formed by cowls 17. Equipment and electronic modules, such as a computer 18 of the EEC type (electronic engine control), are mounted in this annular space.

The air flow contained in the annular space in the nacelle 12 is relatively hot. The computer 18, which comprises electronic boards having low thermal stability, therefore has to be ventilated by a system 20 that draws off colder air flowing along the nacelle. The drawn-off air has a temperature of between approximately 0 and 55° C. when the turbine engine is on the ground.

The system 20 comprises a duct 22 for supplying the drawn-off air to the housing 24 of the computer, which comprises ducts 26, 26' through which a ventilation air flow passes.

The housing 24 of the computer comprises one or more digital inputs and one or more digital outputs. It has a general parallelepiped shape and comprises an upper wall 28 and a bottom or lower wall 29 (FIG. 4) which each cover and define a plurality of ducts 26, 26'. In the example shown in FIG. 4, the ducts 26, 26' are rectilinear and parallel, and are separated from one another by rectilinear fins 33.

The inlets 30 of the ducts 26, 26' are connected to the air-supply duct 22 by a collector 31. The outlets 32 of the ducts 26 lead onto the outer (upper) surface 34 of the wall 28, and the outlets of the ducts 26' lead onto the outer (lower) surface of the bottom wall 29, in order to discharge the ventilation air flows towards the outside of the housing, into the annular space in the nacelle 12.

Figure 2:
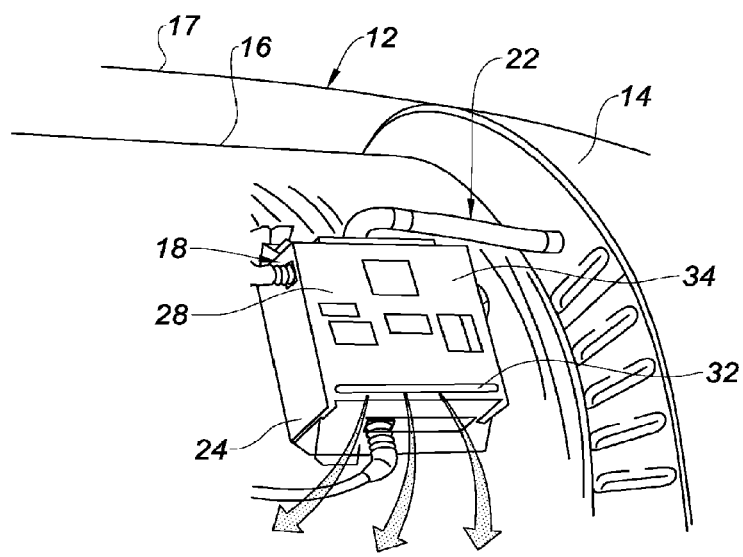
FIG. 2 is a schematic perspective view of the on-board computer of the turbine engine in FIG. 1.

The ducts 26 may have a shared air outlet which is in the form of an elongate slot, as shown in FIGS. 2 and 4. The air flow leaving the ducts 26 has a temperature which is not generally greater than 90° C., while the air flow contained in the annular space may have a temperature of greater than 100° C.

Figure 3:
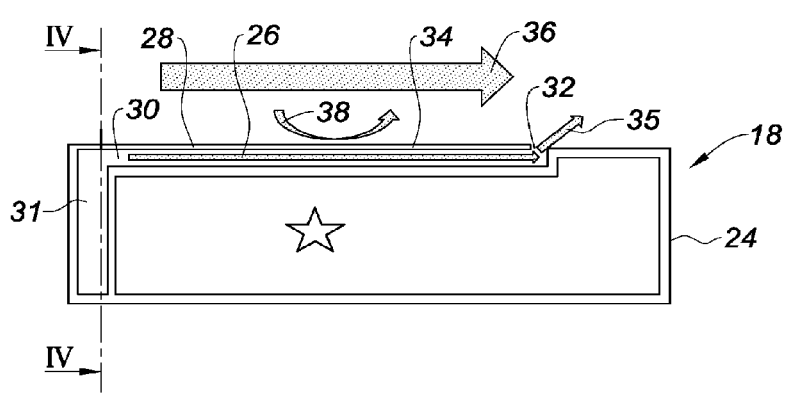
FIG. 3 is a schematic sectional view of the on-board computer in FIG. 2, and shows the prior art for the invention.

As can be seen in FIG. 3, the air flow which leaves the housing (arrow 35) mixes with the air 36 in the annular space. Moreover, the air 36 from the annular space transfers heat to the wall 28 by convection (arrow 38), which wall tends to heat the ventilation air flow flowing in the ducts 26.

The invention, of which the general principle is shown in FIG. 5, proposes diverting and/or guiding at least some of the air flow leaving the housing (arrow 35') so that an air flow circulates on the outer surface 34 of the wall 28 (arrow 40). This air flow 40 is thus reused to ventilate the computer 18 from the outside, by allowing the heat exchanges by convection (arrow 38') with the wall 28. The air flow 40 thus protects the wall 28 from the air flow 36 by a "screen effect".

This is made possible by means for diverting and/or guiding at least some of the air flow leaving the ducts 26, these means comprising one or more members that are attached and fastened to the wall 28 and/or the housing 24, in the embodiments of the invention described in the following.

Figure 7:
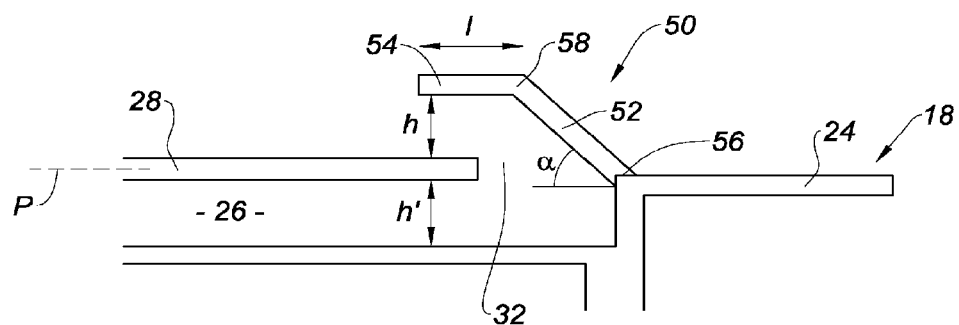
FIG. 7 is a larger-scale view of a part of FIG. 6, FIGS. 8 and 9 are views corresponding to FIG. 7 and showing variants of the invention.

In the embodiment shown in FIGS. 5 to 7, the outlet 32 of the ducts 26 is also in the form of a rectilinear elongate slot. Here, a diverting and guiding metal sheet 50 is attached and fastened to the wall 28, for example by bonding, brazing or welding.

The metal sheet 50 has a general elongate shape and extends along the outlet 32. It has a length that is at least equal to that of the outlet 32. In addition, it has a width or a transverse dimension that is greater than that of the outlet and covers said outlet completely, while allowing the ventilation air flow to be discharged between the metal sheet and the wall.

The metal sheet 50 has a curved shape in section and comprises two adjacent longitudinal portions 52, 54 that are inclined relative to one another. A first longitudinal portion 52 has a longitudinal edge 56 that is connected to a longitudinal edge of the outlet 32, and extends towards the outside of the housing 24 so as to be inclined relative to the plane P of the wall. As can be seen in FIG. 7, the portion 52 of the metal sheet is inclined by an angle $\alpha$ of between 30° and 60°, and for example 45°, relative to the plane P. This first portion 52 covers some of the width or transverse dimension of the outlet 32.

The longitudinal edge 58 opposite the first portion 52 is connected to one of the longitudinal edges of the second portion 54 of the metal sheet, which extends in parallel with the plane P and has a width l or transverse dimension such that the free longitudinal portion thereof covers, at a distance h, the wall 28 and defines an outlet for a ventilation air flow therewith which is oriented in parallel with the plane P (arrow 40). The height or distance h is preferably substantially equal to that h' of the ducts 26. For metal sheet 50 covers this outlet 32, it is necessary in this case for the width l of the portion 54 to be such that: l+h/tangent ($\alpha$)>S, S being the width of the outlet.

Figure 8:
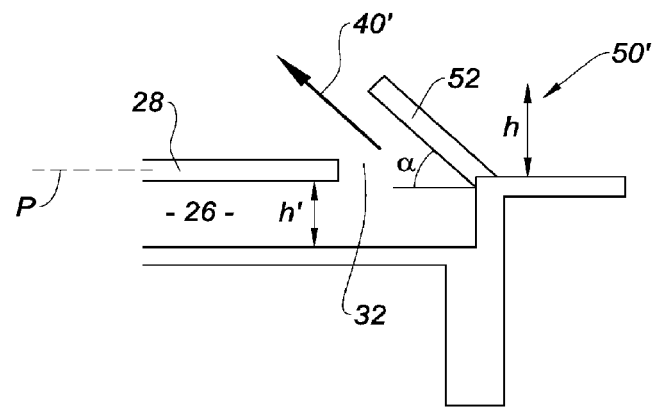

The variant in FIG. 8 differs from the embodiment described above essentially in that the metal sheet 50' comprises only one portion 52, and therefore not the portion 54. Owing to the absence of the portion 54, the air flow leaving the ducts 26 (arrow 40') has an orientation which depends on the angle $\alpha$ of inclination of the portion 52 relative to the plane P, this angle being approximately 45° here.

Figure 9:
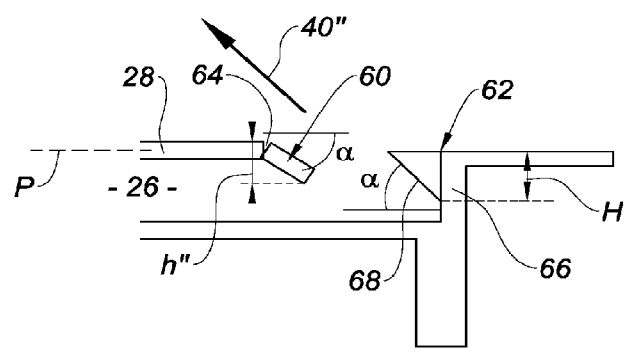

In the variant of the invention shown in FIG. 9, two members 60, 62 are attached and fastened in the outlet of the ducts 26.

The first member is a metal sheet 60 which has a rectilinear elongate shape and of which one longitudinal edge 64 is connected to a longitudinal edge of the outlet 32, this metal sheet 60 being inclined relative to the plane P of the wall 28 and extending towards the interior of the outlet 32 of the ducts 26. The metal sheet 60 has a length that is less than or equal to that of the outlet 32 and has a width or transverse dimension that is less than that of the outlet. The metal sheet 60 has, for example, a width of between ¼ and ⅓ of that of the outlet. Moreover, the height h" of the metal sheet 60 is between ⅓ and ½ of that of the ducts 26. As can be seen in the figure, owing to the fact that the metal sheet 60 extends towards the interior of the outlet, it slightly reduces the outlet cross section of the ducts 26 and therefore makes it possible to accelerate the air flow at the outlet of said ducts. The metal sheet 60 is inclined by an angle $\alpha$ of between 30° and 60°, and for example of 45°, relative to the plane P. The outer surface of the metal sheet 60 defines a surface for guiding the air flow leaving the ducts 26.

The second member is an elongate bar 62 having a triangular cross section. This bar 62 is fastened by one 66 of its sides to the wall 28 or to the housing, along the outlet 32, such that another 68 of the sides of the bar forms a surface for guiding the air flow leaving the ducts 26, which is substantially parallel to the metal sheet 60. The bar 62 has a length that is less than or equal to that of the outlet 32, a width or transverse dimension that is between ¼ and ⅓ of that of the outlet 32 and a height H of between ½ and ⅔ of that of the ducts 26.

As in the embodiment in FIG. 8, the air flow leaving the ducts 26 (arrow 40") has an orientation which depends on the angle $\alpha$ of inclination of the guide surfaces of the metal sheet 60 and of the bar 62 relative to the plane P, this angle being approximately 45° here.

Figure 10:
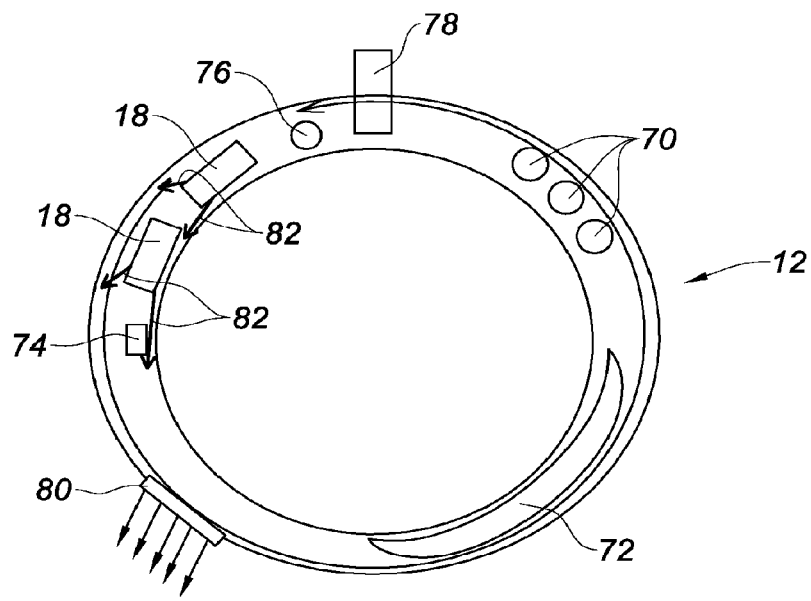
FIG. 10 is a highly schematic cross-sectional view of a nacelle of a turbine engine according to the prior art.
Figure 11:
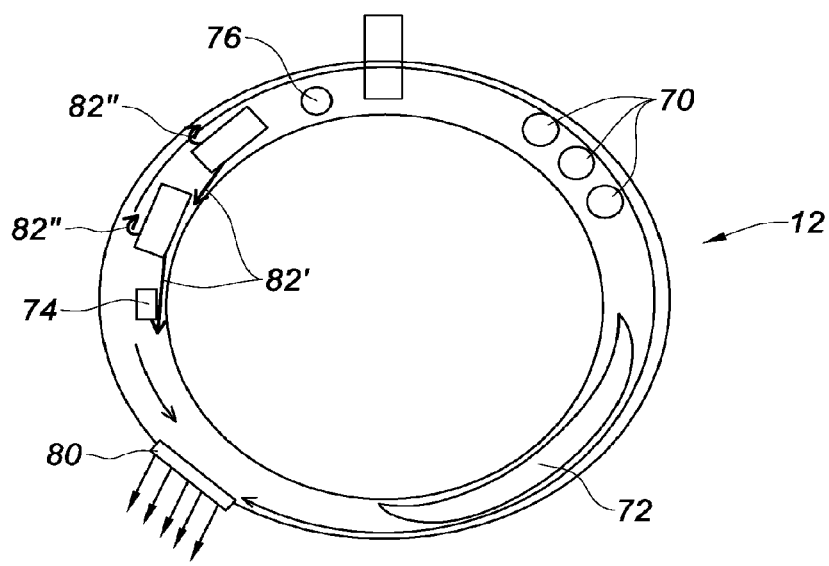
FIG. 11 is a schematic cross-sectional view of a turbine-engine nacelle according to the invention.

Each of FIGS. 10 and 11 are schematic cross-sectional views of a turbine-engine nacelle. As explained above, this nacelle defines an internal annular space in which a plurality of pieces of equipment are mounted. The reference numerals 70, 72, 74 and 76 respectively denote exchangers, an AGB gearbox, a pressure sensor housing (PSS) and fans connected to two EEC computers 18, these fans being intended to suck in air flowing on the outside of the nacelle in the above-mentioned duct 22. The reference numeral 78 denotes the strut of the turbine engine and, lastly, the reference numeral 80 denotes a grating for discharging air from the inner space in the nacelle.

FIG. 10 shows the prior art for the present invention. It is noted that the air flows 82 leaving the ventilation ducts defined by the wall 28 and the bottom wall 29 of each computer 18 are oriented substantially in the same tangential direction, and this generates a vortex 84 in the annular space, which provides heat originating from the AGB gearbox 72 and from the exchangers 70 to the fans 76 and to the PSS housing 74.

As shown in FIG. 11, the invention makes it possible to overcome this problem due to the fact that the air flows 82', 82" leaving the ventilation ducts defined by the wall 28 and the bottom wall 29 of each computer 18 are now oriented in substantially opposite tangential directions. This is made possible by the fact that means for diverting and/or guiding an air flow such as those described above are mounted at the outlet of the ducts through which a ventilation air flow passes on only one of the faces of each computer 18. In the example shown, the outlet of the ducts defined by the bottom wall (radially inner wall) of each computer is not modified, the air flow leaving the ducts defined by the wall of each computer being diverted and/or guided, as described above. The air flows 82' leaving the ducts defined by the bottom wall of each computer 18 circulate in a circumferential portion of the nacelle in order to ventilate the PSS housing 74, and then are discharged through the grating 80. The air flows 82" leaving the ducts defined by the wall of each computer 18 circulate in the remainder of the nacelle in order to first ventilate the fan 76 and then to pass around the exchangers 70 and the gearbox 72 before being discharged through the grating 80. The annular space in the nacelle therefore comprises two zones: one relatively cold zone in which the EEC computers 18 are located, and one relatively hot zone in which the gearbox 72 is located.

The invention claimed is:

1. An electronic equipment for a turbine engine, comprising a first wall of which the inner surface defines at least one duct through which a ventilation air flow passes, the outlet of which leads onto an outer surface of the wall with a view to discharging the ventilation air flow towards the outside of the equipment, wherein, in the region of this outlet, means for diverting and/or guiding at least some of the discharged air flow over at least part of said outer surface of the wall in a direction opposite to the ventilation airflow in the duct.

2. The equipment according to claim 1, wherein the equipment is an on-board computer of the EEC type and comprises a housing comprising electronic boards, said wall covering the housing.

3. The equipment according to claim 1, wherein the diverting and/or guiding means comprise at least one member that is attached and fastened to the equipment.

4. The equipment according to claim 1, wherein said outlet of the duct is formed by a slot, the diverting and/or guiding means comprising at least one metal sheet which extends along the slot and covers said slot at least in part.

5. The equipment according to claim 4, wherein the metal sheet is inclined at least in part relative to the plane of the wall by an angle ($\alpha$) of between 30° and 60°.

6. The equipment according to claim 4, wherein the metal sheet comprises a portion that is parallel to the plane of the wall.

7. The equipment according to claim 1, comprising a second wall, opposite the first wall, the inner surface of this second wall also defining at least one duct through which a ventilation air flow passes, the outlet of which leads onto an outer surface of this second wall and does not comprise diverting and/or guiding means of the above-mentioned type, such that the direction of the air flow discharged by this outlet is substantially opposite that of the air flow discharged by the outlet in the first wall.

8. A turbine engine, comprising at least one piece of equipment according to claim 1.

9. A method for ventilating a nacelle of a turbine engine, this nacelle defining an annular space in which equipment is mounted, including at least one piece of equipment according to claim 7, comprising ventilating a circumferential portion of the annular space using the air flow discharged through the outlet in the first wall and ventilating the remaining circumferential portion of the annular space using the air flow discharged through the outlet in the second wall.

* * * * *